United States Patent [19]

Igarashi et al.

[11] Patent Number: 6,143,803
[45] Date of Patent: Nov. 7, 2000

[54] CURABLE COMPOSITION FOR BACK-PROTECTING MATERIAL IN MAKING SHADOW MASK

[75] Inventors: Ichiro Igarashi; Tetsuji Jitsumatsu, both of Nagoya, Japan

[73] Assignee: Toagosei Co., Ltd., Tokyo, Japan

[21] Appl. No.: 09/338,502

[22] Filed: Jun. 23, 1999

[30] Foreign Application Priority Data

Jul. 1, 1998 [JP] Japan .................................. 10-201215
Jul. 1, 1998 [JP] Japan .................................. 10-201324

[51] Int. Cl.⁷ .............................. C08F 2/46; C08F 20/36; C08F 20/50; G03F 7/027; G03F 7/028
[52] U.S. Cl. .............................. 522/18; 522/64; 522/117; 522/173; 522/182; 430/281.1; 430/286.1
[58] Field of Search ..................................... 522/173, 182, 522/117, 64, 18; 430/281.1, 286.1

[56] References Cited

U.S. PATENT DOCUMENTS 4,985,472 1/1991 Aosai et al. .
5,449,702 9/1995 Tayama et al. .
5,876,805 3/1999 Ostlie .

FOREIGN PATENT DOCUMENTS 1-261410 10/1989 Japan .
2-110166 4/1990 Japan .
2-133404 5/1990 Japan .

Primary Examiner—Susan W. Berman
Attorney, Agent, or Firm—Browdy and Neimark

[57] ABSTRACT

The present invention provides a curable composition for back-protecting material used in making shadow masks which gives a cured film excellent in all of etching resistance, alkali solubility or peelability, and pattern formability even when a second etching is carried out at high temperatures. That is, the present invention provides a curable composition for back-protecting material used at a second etching step in making shadow masks which comprises the following components (a), (b) and (c) and which gives a cured film having alkali solubility or alkali peelability:

(a) a compound having one carboxyl group and one (meth)acryloyl group,
(b) a tri(meth)acrylate of an alkylene oxide adduct of isocyanuric acid, and
(c) (c1) a (meth)acrylate compound having two or more (meth)acryloyl groups, (c2) a chain transfer agent, or a combination of (c1) and (c2).

19 Claims, 1 Drawing Sheet

CURABLE COMPOSITION FOR BACK-PROTECTING MATERIAL IN MAKING SHADOW MASK

FIELD OF THE INVENTION

The present invention relates to a composition for back-protecting materials used at a second etching step in making shadow masks, said composition having such characteristics that it can be coated on the surface of a metal plate having fine dents without forming bubbles, and can be cured by heating or irradiation with active energy rays such as ultraviolet rays and electron beams, and it can give a cured film having corrosion resistance against acid treatment, and having solubility or peelability with alkali treatment.

DESCRIPTION OF RELATED ART

A shadow mask has a function to collide electrons emitted from an electron gun in a Braun tube for color television against the phosphor of a particular color, and it is a thin metal plate provided with many fine holes such as rectangular holes, narrow rectangular holes (aperture grill type) or circular holes which are formed in a given pattern by etching.

Of these shadow masks, those which have circular holes are used for CRT in personal computers or the like, and those which have narrow rectangular holes (aperture grill type) are used for high-resolution or high-luminance televisions. These shadow masks are demanded to have fine and highly accurate holes. In making these shadow masks, dents are made by a first etching on the front and back sides of a metal plate at the corresponding positions. A cured film of a back-protecting material is formed on one side of the metal plate, followed by carrying out a second etching to allow the corresponding dents to communicate with each other at their bottoms.

The outline of the production process of shadow masks will be explained. First, a photosensitive resin is coated on both the front and back sides of a thin metal plate of iron or the like. Then, a negative film having a pattern is brought into close contact with the metal plate, and these are subjected to photographic printing to cure the exposed portions of the photosensitive resin, followed by development to remove the unexposed portions of the photosensitive resin.

Thereafter, a first etching is carried out with an etching solution such as iron trichloride to form fine dents on both the front and back sides which do not communicate with each other between the front and back sides. A composition for back-protecting material is coated on only one side of the metal plate after subjected to the first etching, and the composition is cured by irradiation with active energy rays such as ultraviolet rays or by heating to form a cured film which fills up the fine dents on the one side of the metal plate.

After the one side is protected in this way, a second etching for the dents on the other side is carried out with an etching solution to allow the dents on the one side formed by the first etching and the dents on the other side to communicate with each other at their bottoms. Then, the cured film of the photosensitive resin for the formation of patterns and that of the composition for back-protecting material are removed by alkali treatment to obtain a shadow mask.

The second etching using the composition for back-protecting material can solve the problem of reduction in accuracy of holes which is caused by the presence of abnormally large holes or irregular holes formed when the holes are made only by the first etching.

In the above process for production of shadow masks, the composition for back-protecting material which is used after the first etching, must satisfy the following characteristics ①–⑥.

① Dent-filling property: A property capable of uniformly wetting the surface of a material having hemispherical dents having a diameter of 50–200 μm or narrow rectangular dents having a width of 50–200 μm and a length of 10–200 cm and filling the dents without forming bubbles in the dents.

② Surface smoothness: This is the property that bubbles generated by a slight gas produced when the composition for back-protecting material fills the circular or narrow rectangular dents, do not remain in the resin surface layer after cured, and the surface of the cured film is smooth.

③ Curability: The property of the composition being cured uniformly to the bottom of the dent.

④ Etching resistance: This is the property that the cured film has etching resistance against the second etching conducted with an etching solution such as iron trichloride, and protects the surface of the coated material.

⑤ Alkali solubility: The property of the cured film being easily dissolved or peeled by alkali treatment.

⑥ Pattern formability: A property capable of forming fine holes faithful to the pattern drawn on the negative film (negative pattern) in a thin metal plate. For example, in the case of a negative pattern comprising many narrow rectangular fine holes formed at a given interval with the longer sides of the rectangles being in parallel to each other, the property is such that the holes are formed in the metal plate while the regular shapes peculiar to the negative pattern are maintained, for example, under the conditions that the longer sides are linear, the longer sides of adjacent holes are parallel to each other, and the distance between the longer sides of adjacent holes is the same, and no distortion occurs in the metal portions between the longer sides of the narrow rectangular holes.

As the composition for back-protecting materials which satisfies the above characteristics, there has been used a composition which is prepared by dissolving in an organic solvent a resin which forms a film soluble in an alkaline liquid. The composition is coated by spraying and other methods, and then the organic solvent is evaporated by a warm air drying oven or the like to form a resin coated film. However, this composition suffers from the problems that ① since the composition contains the organic solvent in a large amount, there are needed a drying oven for the evaporation of the organic solvent after coating the composition and an apparatus for recovering the evaporated solvent, and ② since a large amount of the organic solvent is evaporated at the time of drying, there are dangers of toxicity, ignition and explosion. In order to reduce the risks of ignition, explosion and fire at the drying step, use of chlorine-based solvents having non-flammability, such as trichloroethylene, is investigated, but recently it has been pointed out that these solvents cause problems such as air pollution, and use of them tends to be prohibited.

As compositions for back-protecting materials which solve the above problems, proposed are, for example, use of aqueous ultraviolet curing compositions (JP-A-1-261410 and JP-A-2-133404) and use of substantially solventless ultraviolet curing compositions (JP-A-2-110166).

At present, in the production of shadow masks, it is investigated to carry out the etching at high temperatures for the purpose of shortening of the steps and/or controlling of the shape of holes by changing the etching temperatures.

However, none of the cured films obtained from conventional compositions for back-protecting materials are satisfactory in all of etching resistance at high temperatures, solubility in alkali or peelability with alkali, and pattern formability.

That is, when a metal plate after the first etching is subjected to back-protecting treatment using a conventional composition and the second etching is carried out at high temperatures, the surface of the metal plate cannot be sufficiently protected from etching solutions and large holes are sometimes formed in the metal plate. On the other hand, when it is attempted to improve etching resistance under the high temperature etching conditions, alkali solubility of the cured film is conspicuously deteriorated, resulting in failure in peeling of the film or deterioration of pattern formability. Therefore, the etching temperature cannot be further raised, when cured films having all of etching resistance, alkali solubility or peelability, and pattern formability are to be obtained using conventional compositions.

OBJECT OF THE INVENTION

The inventors have conducted an intensive research in an attempt to solve the above problems of the conventional compositions for back-protecting materials, that is, to find curable compositions for back-protecting materials in making shadow masks which give cured films excellent in all of etching resistance, alkali solubility or peelability, and pattern formability even when the second etching is carried out at high temperatures.

SUMMARY OF THE INVENTION

That is, the present invention provides a curable composition for back-protecting materials used at a second etching step in making shadow masks which comprises the following components (a), (b) and (c) and which gives a cured film having alkali solubility or alkali peelability:

(a) a compound having one carboxyl group and one (meth)acryloyl group, (b) a tri(meth)acrylate of an alkylene oxide adduct of isocyanuric acid, and (c) (c1) a (meth)acrylate compound having two or more (meth)acryloyl groups, (c2) a chain transfer agent, or a combination of (c1) and (c2).

DETAILED DESCRIPTION OF THE INVENTION

Figure 1:
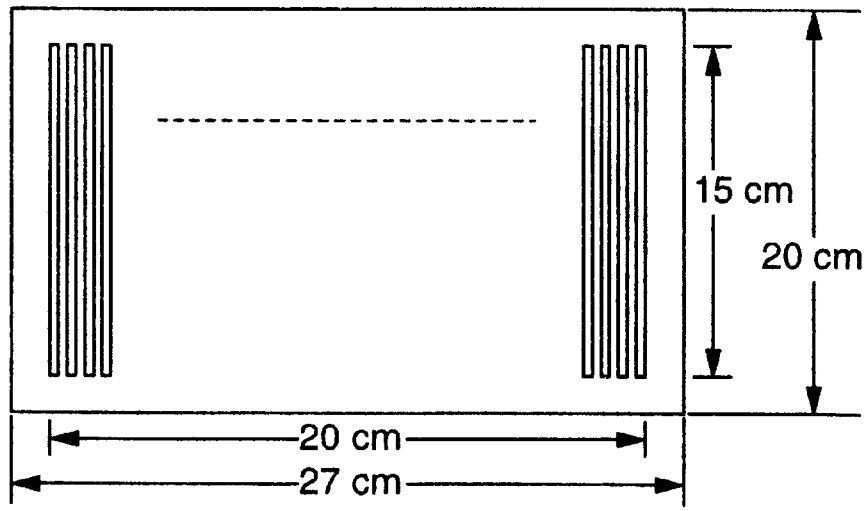
FIG. 1 shows the size of the test iron plate used in Examples.

The present invention will be explained in detail.

In this specification, acryloyl group or methacryloyl group is expressed by "(meth)acryloyl group", acrylate or methacrylate is expressed by "(meth)acrylate", and acrylic acid or methacrylic acid is expressed by "(meth)acrylic acid".

1. Curable composition for back-protecting materials in making shadow masks.

1-1. The Component (a)

The component (a) is a compound having one carboxyl group and one (meth)acryloyl group, and imparts solubility or peelability with alkali treatment to the cured film of the composition of the present invention.

Preferred component (a) includes a reaction product of a dibasic acid or an acid anhydride thereof with a (meth) acrylate having a hydroxyl group at an end, a reaction product of a lactone with a compound having a carboxyl group and a (meth)acryloyl group, or the like.

With regard to the reaction product of a dibasic acid or an acid anhydride thereof with a (meth)acrylate having a hydroxyl group at an end, examples of the dibasic acid or acid anhydride thereof are phthalic acid, tetrahydrophthalic acid, hexahydrophthalic acid, maleic acid and succinic acid, and anhydrides of these dibasic acids. Examples of the (meth)acrylate having a hydroxyl group at an end are hydroxyalkyl (meth)acrylates such as hydroxyethyl (meth) acrylate and hydroxypropyl (meth)acrylate.

As specific compounds, mention may be made of, for example, (meth)acryloyloxyethyl monophthalate (as commercially available products, ARONIX M-5400 manufactured by Toagosei Co., Ltd., and others), (meth) acryloyloxypropyl monophthalate, (meth)acryloyloxyethyl monotetrahydrophthalate, (meth)acryloyloxypropyl monotetrahydrophthalate, (meth)acryloyloxyethyl monohexahydrophthalate, (meth)acryloyloxypropyl monohexahydrophthalate, (meth)acryloyloxyethyl monosuccinate (as commercially available products, ARONIX M-5500 manufactured by Toagosei Co., Ltd., and others), (meth)acryloyloxypropyl monosuccinate, (meth) acryloyloxyethyl monomaleate, and (meth) acryloyloxypropyl monomaleate.

With regard to the reaction products of a lactone and a compound having a carboxyl group and a (meth)acryloyl group, examples of the lactone include ε-caprolactone and others. Examples of the compound having a carboxyl group and a (meth)acryloyl group include (meth)acrylic acid and others.

Specific compounds include, for example, compounds having a carboxyl group at an end of the molecule which are reaction products of ε-caprolactone and (meth)acrylic acid (as commercially available products, ARONIX M-5300 manufactured by Toagosei Co., Ltd., and others).

As the component (a), mention may be made of compounds such as (meth)acrylic acid or the dimer thereof (as commercially available products, ARONIX M-5600 manufactured by Toagosei Co., Ltd., and others) in addition to the compounds enumerated above.

Among the above mentioned compounds as component (a), acrylic acid dimer and (meth)acryloyloxyethyl monosuccinate are preferred because they per se are relatively low in viscosity (200–400 cps at 25° C.) and the compositions of the present invention can be of low viscosity.

The component (a) can comprise two or more compounds in combination.

Amount of the component (a) is preferably 20–80 weight %, more preferably 30–70 weight % based on the total weight of all of the component (a), the component (b) and the component (c1) or the total weight of all of the component (a), the component (b), the component (c1) and other (meth)acrylates, if these are added (hereinafter all of these components are referred to as "curable components"). If the amount is less than 20 weight %, alkali solubility or peelability of the cured film of the composition is insufficient, and if it is more than 80 weight %, corrosion resistance to the second etching is sometimes insufficient.

1-2. The Component (b)

The component (b) is a tri(meth)acrylate of an alkylene oxide adduct of isocyanuric acid, and this component imparts etching resistance to the cured film of the composition at high temperature etching. When the composition contains only mono(meth)acrylate or di(meth)acrylate of an alkylene oxide adduct of isocyanuric acid, etching resistance is deteriorated.

Examples of the tri(meth)acrylate are those which are represented by the following formula (1).

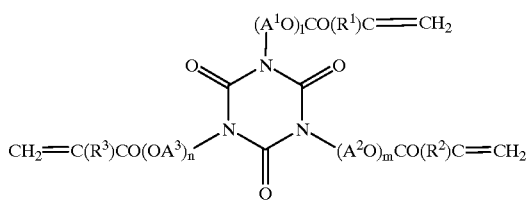

(1)

wherein $A^1$, $A^2$ and $A^3$ each represent an alkylene group of 2–4 carbon atoms; $R^1$, $R^2$ and $R^3$ each represent H or $CH_3$; $A^1$, $A^2$ and $A^3$, and $R^1$, $R^2$ and $R^3$ in one molecule may be the same or different, respectively; and l, m and n each represent a real number of 0–3.0 with the proviso that they satisfy $l+m+n \geq 2.0$.

Preferred examples of the component (b) are tri(meth) acrylates of an adduct of isocyanuric acid with 3 moles of ethylene oxide which are compounds of the formula (1) where $A^1$, $A^2$ and $A^3$ each represent an ethylene group, $R^1$, $R^2$ and $R^3$ each represent H or $CH_3$ and l, m and n each represent 1 (as commercially available products, ARONIX M-315 manufactured by Toagosei Co., Ltd., and others).

Amount of the component (b) is preferably 5–60 weight % based on the total weight of the curable components. If the amount is less than 5 weight %, etching resistance of the cured film of the composition is sometimes deteriorated, and if it is more than 60 weight %, there is the possibility of alkali solubility or peelability of the cured film being insufficient.

1-3. The Component (c)

Component (c1) is a (meth)acrylate having two or more (meth)acryloyl groups (hereinafter referred to as "poly (meth)acrylate"), and this component imparts etching resistance to the cured film of the composition of the present invention. Examples of the poly(meth)acrylates include polyol poly(meth)acrylates, polyester poly(meth)acrylates, and epoxy poly(meth)acrylates. These components will be explained below.

① Polyol poly(meth)acrylates:

These are reaction products of a polyhydric alcohol with (meth)acrylic acid, and examples of them are di(meth) acrylates of diols, such as butanediol di(meth)acrylate, pentanediol di(meth)acrylate, hexanediol di(meth)acrylate, neopentyl glycol di(meth)acrylate, nonanediol di(meth)acrylate, tricyclodecane dimethanol di(meth)acrylate, and di(meth) acrylates of esterified diol of hydroxypivalic acid and neopentyl glycol; di(meth)acrylates of polyether glycols such as polyethylene glycol di(meth)acrylate, polypropylene glycol di(meth)acrylate, and polytetramethylene glycol di(meth) acrylate; and poly(meth)acrylates of polyols such as trimethylolpropane tri(meth)acrylate, pentaerythritol tri- or tetra (meth)acrylate, ditrimethylolpropane tri- or tetra(meth) acrylate, and dipentaerythritol penta- or hexa(meth)acrylate.

Furthermore, mention may be made of reaction products of (meth)acrylic acid with an adduct of a polyhydric alcohol with an alkylene oxide such as ethylene oxide or propylene oxide. Examples thereof are di(meth)acrylates of alkylene oxide adducts of hexane diol, di(meth)acrylates of alkylene oxide adducts of neopentyl glycol, di(meth)acrylates of alkylene oxide adducts of bisphenol A, di(meth)acrylates of alkylene oxide adducts of bisphenol F, di(meth)acrylates of alkylene oxide adducts of hydrogenated bisphenol A, di(meth)acrylates of alkylene oxide adducts of hydrogenated bisphenol F, tri(meth)acrylates of alkylene oxide adducts of trimethylolpropane, tri- or tetra(meth)acrylates of alkylene oxide adducts of pentaerythritol, and di(meth)acrylates of alkylene oxide adducts of tricyclodecane dimethanol.

② Polyester poly(meth)acrylates:

As the polyester poly(meth)acrylates, mention may be made of reaction products of polyester type polyhydric alcohols with (meth)acrylic acid. Examples of the polyester type polyhydric alcohols are polyester alcohols obtained by reacting polybasic acids such as succinic acid, maleic acid, adipic acid, sebacic acid, phthalic acid, tetrahydrophthalic acid, hexahydrophthalic acid and trimellitic acid, or anhydrides thereof with ethylene glycol, diethylene glycol, triethylene glycol, propylene glycol, dipropylene glycol, tripropylene glycol, butanediol, neopentyl glycol, pentanediol, hexanediol, nonanediol, trimethylolpropane, glycerin, or pentaerythritol.

③ Epoxy poly(meth)acrylates:

They are compounds obtained by reacting epoxy groups of epoxy compounds having two or more epoxy groups in the molecule with (meth)acrylic acid. Examples of these epoxy compounds are diepoxy compound of bisphenol A, polyvalent epoxy compounds of phenolic novolak and polyvalent epoxy compounds of cresol novolak.

In addition to the above-mentioned compounds, poly (meth)acrylates include phosphoric acid poly(meth) acrylates obtained by reacting acids such as phosphoric acid with (meth)acrylates having an end hydroxyl group.

As the compounds of the component (c1), preferred are diacrylate of tripropylene glycol, diacrylate of an ethylene oxide adduct of bisphenol A, diacrylate of esterified diol prepared from neopentyl glycol and hydroxypivalic acid, diacrylate of tricyclodecane dimethanol, triacrylate of trimethylolpropane, and triacrylate of pentaerythritol.

Amount of the component (c1) is preferably 3–40 weight % based on the total weight of the curable components. If the amount is less than 3 weight %, etching resistance is sometimes deteriorated, and if it is more than 40 weight %, there is the possibility of the cured film being insufficient in alkali solubility or peelability.

The component (c2) is a chain transfer agent, which gives alkali solubility or peelability and pattern formability to the cured film of the composition.

Various compounds known in the art can be used as the chain transfer agent, and monothiol compounds are preferred. The monothiol compounds include, for example, mercaptans such as octylmercaptan, nonylmercaptan, decylmercaptan, dodecylmercaptan, and cetylmercaptan; hydroxyl group-substituted mercaptans such as monothioethylene glycol and α-monothioglycerin; and mercaptocarboxylic acids such as mercaptopropionic acid, 2-mercaptopropionic acid, thiolactic acid, and thiomalic acid.

Amount of the component (c2) is preferably 0.01–5 parts by weight, more preferably 0.1–3 parts by weight (hereinafter the term "part(s)" means "part(s) by weight") for 100 parts in total of the curable components. If the amount is less than 0.01 part, the cured film is insufficient in alkali solubility or peelability, which may cause nonuniform intervals between holes formed in the metal plate or distortion of the metal portions between adjacent holes. If it is more than 5 parts, there may occur reduction in stability of the composition and increase in viscosity of the composition.

Viscosity at 25° C. of the composition of the present invention is preferably 10,000 cps or lower, more preferably 5,000 cps or lower. If the viscosity at 25° C. of the composition is higher than 10,000 cps, it sometimes becomes difficult to uniformly wet the surface of the metal material having dents to fill up the dents. The viscosity of the composition can easily be adjusted by suitably selecting the kinds and amounts of the above various components or by adding the following other components.

1-4. Other Components

The composition of the present invention comprises the above components (a), (b) and (c) as essential components, and, if necessary, may additionally contain a leveling agent, a polymerization initiator, a (meth)acrylate other than the components (a), (b) and (c1), and others which are referred to below.

These components will be explained.

1-4-1. Leveling Agent

It is preferred that the composition of the present invention additionally contains a leveling agent for improving the dent-filling property of the composition and the surface smoothness of the cured film. As the leveling agent, general surface active agents can be used.

As examples thereof, mention may be made of FLORAD FC-430 (manufactured by Sumitomo 3M Co., Ltd.), MEGAFACK F-177 (manufactured by Dainippon Ink & Chemicals Inc.) and MEGAFACK F-179 (manufactured by Dainippon Ink & Chemicals Inc.) which are nonionic fluorinated alkyl esters, and NUC SILICONE L 7002 (manufactured by Nippon Unicar Co., Ltd.) and FZ-2165 (manufactured by Nippon Unicar Co., Ltd.) which are silicone compounds.

Of the above compounds, MEGAFACK F-179 and NUC SILICONE L 7002 are preferred because these are less in formation of bubbles and a resin coating film excellent in surface smoothness can be easily obtained.

Amount of the leveling agent added is preferably 0.01–5 parts for 100 parts in total of the curable components. If the amount is less than 0.01 part, it sometimes becomes difficult to impart the characteristics of dent-filling property and surface smoothness to the composition, and if it exceeds 5 parts, defects are apt to occur in the resin coating film.

1-4-2. Polymerization Initiator

The composition of the present invention can be cured by irradiation with active energy rays such as ultraviolet rays, visible rays and electron beams, or by heating, and the composition can be cured in a short time by adding the following components depending on the curing method.

When the composition is cured in a short time by irradiation with ultraviolet rays or visible rays, the following generally employed photopolymerization initiators and sensitizers are used to sufficiently exhibit the photocurability of the composition.

Examples of preferred photopolymerization initiators are 2-methyl-[4-(methylthio)phenyl]-2-morpholino-1-propanone (IRGACURE-907 manufactured by Ciba-Geigy Corp.), benzyldimethyl ketal (IRGACURE-651 manufactured by Ciba-Geigy Corp.), 1-hydroxycyclohexylphenyl ketone (IRGACURE-184 manufactured by Ciba-Geigy Corp.), diethoxyacetophenone (FASTCURE-DEAP manufactured by Fast Chemical Co., Ltd.), 2-hydroxy-2-methyl-1-phenylpropane-1-one (DALOCURE-1173 manufactured by Ciba-Geigy Corp.), 4-(2-hydroxyethoxy)phenyl(2-hydroxy-2-propyl) ketone (IRGACURE-2959 manufactured by Ciba-Geigy Corp.), and 2-benzyl-2-dimethylamino-1-(4-morpholinophenyl)-butanone (IRGACURE-369 manufactured by Ciba-Geigy Corp.) as acetophenone photopolymerization initiators; benzoin, benzoinmethyl ether, benzoinethyl ether, benzoinisopropyl ether, and benzoinisobutyl ether as benzoin ether photopolymerization initiators; benzophenone, methyl o-benzoylbenzoate, 4-phenylbenzophenone, 4-benzoyl-4'-methyl-diphenyl sulfide, and 2,4,6-trimethylbenzophenone as benzophenone photopolymerization initiators; 2-isopropylthioxantone, 2,4-diethylthioxanthone, 2,4-dichlorothioxanthone, and 1-chloro-4-propoxythioxanthone as thioxanthone photopolymerization initiators; and 2,4,6-trimethylbenzoyldiphenylphosphine oxide and bis(2,6-dimethoxybenzoyl)-2,4,4-trimethylpentylphosphine oxide as acylphosphine oxide photopolymerization initiators. Moreover, camphorquinone and others can be used.

Examples of preferred sensitizers are triethanolamine, methyldiethanolamine, triisopropanolamine, methyl 4-dimethylaminobenzoate, ethyl 4-dimethylaminobenzoate, isoamyl 4-dimethylaminobenzoate, 4,4-dimethylaminobenzophenone, and 4,4-diethylaminobenzophenone.

Among these photopolymerization initiators, acylphosphine oxide photopolymerization initiators and/or 1-hydroxycyclohexylphenyl ketone are preferred since these can improve pattern formability and prevent occurrence of defects such as formation of abnormally large holes in metal plate in making shadow masks.

When the composition is cured mainly by heat energy sources such as heating oven, infrared rays and microwave, it is preferred to add thermal-polymerization initiators. Suitable thermal-polymerization initiators include, for example, azo compounds such as azoisobutyronitrile, various organic peroxides such as ketone peroxides, hydroperoxides, alkyl peroxides, acyl peroxides, and peroxy esters, and inorganic peroxides such as ammonium persulfate.

When the heating is carried out at relatively low temperatures of 100° C. or lower or by leaving the composition at room temperature, it is preferred to add polymerization accelerators together with the thermal-polymerization initiators. Examples of preferred polymerization accelerators are organometallic salts of metals such as cobalt, iron and manganese with naphthenic acid, linolic acid or acetylacetone, reducing amines such as dimethylparatoluidine and ascorbic acid, and other reducing substances.

These polymerization accelerators are used in combination of, for example, hydroperoxides, ketone peroxides or peroxy esters with organometallic salts, or acyl peroxides with reducing amines.

Amount of the polymerization initiators is preferably 0.1–15 parts, more preferably 0.5–10 parts for 100 parts in total of the curable components. If the amount is less than 0.1 part, the effect to accelerate the initiation of polymerization is insufficient, and if it exceeds 15 parts, amount of the components truly necessary for cured film is reduced, and the desired characteristics of the cured film is sometimes deteriorated.

As mentioned above, the composition of the present invention can be cured by either of active energy rays or heating, but irradiation with active energy rays is preferred because curing can be performed at a high energy efficiency and space for an equipment of energy source can be saved.

1-4-3. (Meth)acrylates Other Than the Components (a), (b) and (c1)

If necessary, (meth)acrylates having one (meth)acryloyl group (hereinafter referred to as "monofunctional (meth) acrylates") can be added to the composition of the present invention in order to adjust viscosity of the composition and alkali solubility or peelability of the cured film.

Examples of preferred monofunctional (meth)acrylates are alkyl (meth)acrylates such as methyl (meth)acrylate, ethyl (meth)acrylate, propyl (meth)acrylate, butyl (meth) acrylate, and 2-ethylhexyl (meth)acrylate; hydroxyalkyl (meth)acrylates such as hydroxyethyl (meth)acrylate and hydroxypropyl (meth)acrylate; (meth)acrylamides such as (meth)acrylamide, diacetone (meth)acrylamide, and dimethyl (meth)acrylamide; monoalkyl ($C_{1-9}$) ether mono(meth) acrylates of polyalkylene glycols such as polyethylene glycol and polypropylene glycol; polyalkylene glycol mono (meth)acrylates such as polyethylene glycol mono(meth) acrylate and polypropylene glycol mono (meth)acrylate; mono (meth)acrylates of alkylene oxide adducts of phenols such as mono(meth)acrylate of an ethylene oxide or propylene oxide adduct of phenol, mono(meth)acrylate of an ethylene oxide or propylene oxide adduct of nonylphenol, and mono(meth)acrylate of an ethylene oxide or propylene oxide adduct of p-cumylphenol; benzyl (meth)acrylate; (meth)acryloylmorpholine; tetrahydrofurfuryl (meth) acrylate; isobornyl (meth)acrylate; and compounds represented by the following formulas (2) and (3). At least one of them can be used.

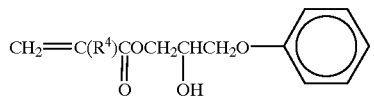

(2)

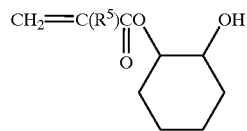

(3)

In the formulas (2) and (3), $R^4$ and $R^5$ each represent H or $CH_3$.

Amount of the monofunctional (meth)acrylates is preferably 0–40 weight % based on the total weight of the curable components.

1-4-4. Other Components

In addition, water or organic solvents can be added to the composition of the present invention in order to lower the viscosity of the composition.

Examples of the organic solvents are alcohols such as methanol, ethanol, butanol, and isopropyl alcohol; cellosolves such as butyl cellosolve, methyl cellosolve and ethyl cellosolve; cellosolve acetates such as methyl cellosolve acetate, ethyl cellosolve acetate and butyl cellosolve acetate; propylene glycol monomethyl ether; toluene; and xylene.

Amount of the organic solvents is preferably 0–10 parts for 100 parts in total of the curable components.

Furthermore, polymers soluble in the curable components and having a molecular weight of 1000–100000, or particulate fillers insoluble in the curable components can be added in order to relax the strain at the time of curing.

The composition of the present invention can be obtained by uniformly mixing the above components by a usual mixing method, and there are no limitations in the sequence of mixing and the mixing apparatus. However, the components can be heated to a temperature at which they are molten or dispersed, and then mixed in place of mixing the components which are solid at room temperature.

2. Method for Production of Shadow Mask

The composition of the present invention can be applied to both the production of a shadow mask having many circular holes and the production of a shadow mask having many narrow rectangular holes, and it can be especially preferably used for the production of a shadow mask having many narrow rectangular holes (aperture grill type).

Production method of a shadow mask will be explained below.

First, a photosensitive resin such as casein or polyvinyl alcohol is coated on both the front and back sides of a thin metal plate of iron or the like. Then, a negative film provided with a pattern is brought into close contact with the metal plate, and photographic printing is carried out to cure the exposed portion of the photosensitive resin, followed by development treatment to remove the unexposed portion of the photosensitive resin.

Then, a first etching is carried out with an etching solution such as iron trichloride to form fine dents which do not communicate with each other between the front and back sides.

A composition for back-protecting material is coated on one side of the metal plate after subjected to the first etching, and the composition is cured by irradiation with active energy rays such as ultraviolet rays or by heating. In this case, the composition can be coated by conventional coating methods such as spray coating, flow coating, roll coating, die coating and dip coating.

After the curing step of the composition for back-protecting material, an etching solution is supplied to the metal plate, and a second etching is carried out for the dents on the other side of the metal plate to allow the dents on the one side formed by the first etching and the dents on the other side to communicate with each other at their bottoms. Temperature for the second etching is usually 40–90° C. As mentioned above, since the composition of the present invention has both the etching resistance and the alkali solubility or peelability for the second etching at high temperatures, the composition is also suitably applicable to the second etching at high temperatures of 70–90° C.

An alkali solution is supplied to the resulting metal plate having many holes to dissolve or peel from the metal plate the film of the photosensitive resin and the cured film of the composition for back-protecting material. In this case, an aqueous solution of NaOH, KOH or the like can be used as the alkali solution.

DESCRIPTION OF THE PREFERRED EMBODIMENTS

The present invention will be explained more specifically by the following examples and comparative examples, in which "part(s)" means "part(s) by weight".

Examples 1–3

A composition for back-protection material curable with active energy rays was prepared by dissolving and mixing the components shown in Table 1.

The resulting composition was coated at a film thickness of 30 μm on a test iron plate referred to in the following evaluation method (1). The coat was irradiated with ultraviolet rays using a condenser-type metal halide lamp of 80 w/cm, and curing of the resin was ascertained by the fact that the surface of the coat had no tack. The resulting cured film was evaluated on dent-filling property, surface smoothness, etching resistance, alkali solubility or peelability, and pattern formability by the following methods. The results are shown in Table 2.

Evaluation Methods (1) Dent-Filling Property

Figure 2:
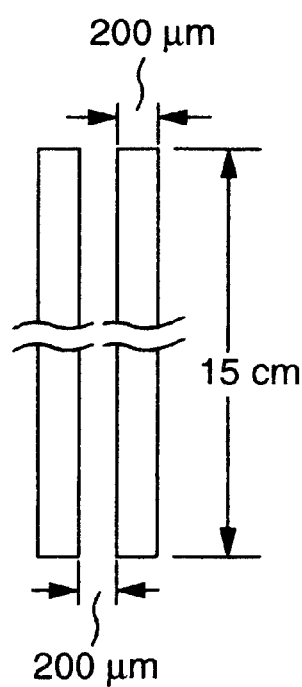
FIG. 2 shows the size of narrow rectangular dents formed in the test iron plate used in Examples.

A negative pattern was formed on both sides of an iron plate using a casein photosensitive resin, and many narrow rectangular dents were formed on both sides by the first etching (hereinafter referred to as merely "test iron plate"). The composition of the present invention was coated on one side of the test iron plate, and the state of the dents being filled up with the composition was visually evaluated. The size of the test iron plate is shown in FIG. 1 and the size of the narrow rectangular dents formed on the test iron plate is shown in FIG. 2.

The results of evaluation were graded by the following criteria.

○: There were no bubbles.

Δ: There were bubbles in a part of the dents.

×: There were bubbles on the whole surface.

(2) Surface Smoothness

The iron plate after evaluated on the dent-filling property was irradiated with ultraviolet rays to cure the composition of the present invention, and the surface state of the cured film was visually evaluated.

The results of the evaluation were graded by the following criteria.

○: There were no cissings.

Δ: There were some cissings.

×: Many cissings were formed.

(3) Etching Resistance

The iron plate after evaluated on the surface smoothness was immersed in a 43% aqueous FeCl$_3$ solution at 90° C. for 20 minutes, and the surface state of the cured film was visually evaluated.

The results of the evaluation were graded by the following criteria.

○: No change occurred.

Δ: Coloration occurred.

×: Swelling or exfoliation occurred.

(4) Alkali Solubility or Peelability

The iron plate after evaluated on the etching resistance was immersed in a 20% aqueous NaOH solution at 80° C. for 1 minute, and solubility or peelability of the cured film was visually evaluated.

The results of the evaluation were graded by the following criteria.

⊚: The film was completely dissolved and peeled.

○: The film was not completely dissolved, but was peeled.

Δ: The peeled film partly remained on the metal plate.

×: The film was not peeled.

(5) Pattern Formability

The iron plate after evaluated on the alkali solubility or peelability was washed with water and dried. Then, a light was applied to the iron plate from the back side so as to be able to visually observe by the transmitted light the shape of the narrow rectangular holes formed in the iron plate. Size of the holes, intervals between the holes, and linearity of the longer sides of the rectangles were evaluated depending on the uniformity in brightness of the transmitted light.

The results were graded by the following criteria.

⊚ Size and intervals of the holes were completely uniform, and the longer sides of the rectangles were linear.

○: There was about one defect in about two plates per 100 plates.

Δ: There was about one defect in about 3–9 plates per 100 plates.

×: There were one or more defects in 10 or more plates per 100 plates.

TABLE 1

|  |  |  | Example No. | | |
|---|---|---|---|---|---|
|  |  |  | 1 | 2 | 3 |
| Composition | Component (a) parts | M-5400 | 70 | 50 | 60 |
|  |  | M-5600 | 0 | 10 | 0 |
|  | Component (b) parts | M-315 | 20 | 30 | 20 |
|  | Component (C1) parts | M-203 | 0 | 5 | 10 |
|  |  | M-220 | 10 | 0 | 0 |
|  |  | M-305 | 0 | 5 | 0 |
|  | Component (C2) part | Dodecyl mercaptan | 0 | 0.5 | 0 |
|  |  | Mercaptopropionic acid | 0 | 0 | 0.5 |
|  | Leveling agent part | MEGAFACK F177 | 0.1 | 0.1 | 0 |
|  |  | NUC SILICONE L7002 | 0 | 0 | 0.2 |
|  | Monofunctional acrylate parts | ACMO | 0 | 0 | 10 |
|  | Photopolymerization initiator parts | IRGACURE-1700 | 5 | 0 | 0 |
|  |  | RUCILIN TPO | 0 | 5 | 0 |
|  |  | IRGACURE-184 | 0 | 0 | 5 |
|  | Viscosity (cps/25° C.) |  | 2010 | 2930 | 1880 |

The abbreviations in the Table 1 have the following meanings.

M-5400: ARONIX M-5400; Acryloyloxyethyl monophthalate manufactured by Toagosei Co., Ltd.

M-5600: ARONIX M-5600; Acrylic acid dimer manufactured by Toagosei Co., Ltd.

M-315: ARONIX M-315; Triacrylate of trishydroxyethyl isocyanurate manufactured by Toagosei Co., Ltd.

M-203: ARONIX M-203; Diacrylate of tricyclodecane dimethanol manufactured by Toagosei Co., Ltd.

M-220: ARONIX M-220; Diacrylate of tripropylene glycol manufactured by Toagosei Co., Ltd.

M-305: ARONIX M-305; Triacrylate of pentaerythritol manufactured by Toagosei Co., Ltd.

MEGAFACK F-177: Perfluoroalkyl group-containing oligomer manufactured by Dainippon Ink & Chemicals Inc.

NUC SILICONE L 7002: Silicone polymer manufactured by Nippon Unicar Co., Ltd.

ACMO: Acryloylmorpholine manufactured by Kojin Co., Ltd.

IRGACURE-1700: Bis(2,6-dimethoxybenzoyl)-2,4,4-trimethylpentylphosphine oxide manufactured by Ciba Geigy Corp.

RUCILIN TPO: 2,4,6-Trimethylbenzoyldiphenylphosphine oxide manufactured by BASF Corp.

IRGACURE-184: 1-Hydroxycyclohexylphenyl ketone manufactured by Ciba Geigy Corp.

TABLE 2

| Results of Evaluation | | Example No. 1 | Example No. 2 | Example No. 3 |
|---|---|---|---|---|
| Results of Evaluation | Dent-filling property | ○ | ○ | ○ |
| | Surface smoothness | ○ | ○ | ○ |
| | Etching resistance | ○ | ○ | ○ |
| | Alkali solubility or peelability | ○ | ⊚ | ⊚ |
| | Pattern formability | ○ | ⊚ | ⊚ |

Examples 4–6

Compositions for back-protecting material curable with active energy rays were prepared in the same manner as in Examples 1–3, except that the components shown in Table 3 were used.

Evaluation was conducted on the characteristics of the resulting compositions in the same manner as in Examples 1–3. The results are shown in Table 4.

TABLE 3

| | | | Example No. 4 | Example No. 5 | Example No. 6 |
|---|---|---|---|---|---|
| Composition | Component (a) parts | M-5400 | 50 | 60 | 60 |
| | | M-5600 | 10 | 0 | 0 |
| | Component (b) parts | M-315 | 40 | 30 | 30 |
| | Component (C2) part | Dodecyl mercaptan | 1 | 0.5 | 0 |
| | | Mercapto-propionic acid | 0 | 0 | 0.5 |
| | Monofunctional acrylate parts | M-5700* | 0 | 10 | 0 |
| | | ACMO | 0 | 0 | 10 |
| | Leveling agent part | MEGAFACK F177 | 0.1 | 0.1 | 0 |
| | | NUC SILICONE L7002 | 0 | 0 | 0.2 |
| | Photopolymerization initiator parts | IRGACURE-1700 | 5 | 0 | 0 |
| | | RUCILIN TPO | 0 | 5 | 0 |
| | | IRGACURE-184 | 0 | 0 | 5 |
| | Viscosity (cps/25° C.) | | 1790 | 4060 | 4210 |

The abbreviations in Table 3 other than the following have the same meanings as in Table 1.

M-5700: ARONIX M-5700; Acrylic acid adduct of phenyiglycidyl ether manufactured by Toagosei Co., Ltd.

TABLE 4

| | | Example No. 4 | Example No. 5 | Example No. 6 |
|---|---|---|---|---|
| Results of evaluation | Dent-filling property | ○ | ○ | ○ |
| | Surface smoothness | ○ | ○ | ○ |
| | Etching resistance | ○ | ○ | ○ |
| | Alkali solubility or peelability | ○ | ⊚ | ⊚ |
| | Pattern formability | ⊚ | ⊚ | ⊚ |

Comparative Examples 1–4

Compositions for back-protecting material curable with active energy rays were prepared in the same manner as in Examples 1–3, except that the components shown in Table 5 were used.

Evaluation was conducted on the characteristics of the resulting compositions in the same manner as in Examples 1–3. The results are shown in Table 6.

TABLE 5

| | | | Comparative Example No. 1 | Comparative Example No. 2 | Comparative Example No. 3 | Comparative Example No. 4 |
|---|---|---|---|---|---|---|
| Composition | Component (a) parts | M-5400 | 60 | 60 | 70 | 65 |
| | Component (b) parts | M-315 | 0 | 0 | 0 | 15 |
| | Component (C1) parts | M-203 | 0 | 0 | 10 | 0 |
| | | M-220 | 20 | 10 | 0 | 0 |
| | | M-305 | 0 | 30 | 0 | 0 |
| | Component (C2) part | Dodecyl mercaptan | 0.5 | 0 | 0 | 0 |
| | | Mercapto-propionic acid | 0 | 0 | 0.5 | 0 |
| | Leveling agent part | MEGAFACK F177 | 0.1 | 0 | 0 | 0.1 |
| | | NUC SILICONE L7002 | 0 | 0.2 | 0 | 0 |
| | Monofunctional acrylate parts | M-5700 | 20 | 0 | 20 | 0 |
| | | ACMO | 0 | 0 | 0 | 20 |
| | Photopolymerization initiator parts | IRGACURE-184 | 5 | 0 | 0 | 5 |
| | | IRGACURE-651* | 0 | 5 | 5 | 0 |
| | Viscosity (cps/25° C.) | | 510 | 1360 | 1600 | 1500 |

The abbreviations in Table 5 other than the following have the same meanings as in Tables 1 and 3.

IRGACURE-651: Benzylmethyl ketal manufactured by Ciba Geigy Corp.

TABLE 6

| | | Comparative Example No. 1 | Comparative Example No. 2 | Comparative Example No. 3 | Comparative Example No. 4 |
|---|---|---|---|---|---|
| Results of evaluation | Dent-filling property | ○ | ○ | X | ○ |
| | Surface smoothness | ○ | ○ | X | ○ |
| | Etching resistance | X | ○ | X | ○ |
| | Alkali solubility or peelability | ○ | X | ○ | ○ |
| | Pattern formability | X | X | X | X |

Comparative Examples 5–7

Compositions for back-protecting material curable with active energy rays were prepared in the same manner as in Examples 1–3, except that the components as shown in Table 7 were used.

Evaluation was conducted on the characteristics of the resulting compositions in the same manner as in Examples 1–3. The results are shown in Table 8.

TABLE 7

|  |  |  | Comparative Example No. | | |
|---|---|---|---|---|---|
|  |  |  | 5 | 6 | 7 |
| Composition | Component (a) parts | M-5400 | 60 | 60 | 60 |
|  | Component (C1) parts | M-210[a)] | 40 | 0 | 30 |
|  |  | M-309[b)] | 0 | 40 | 0 |
|  | Component (C2) part | Dodecyl mercaptan | 0.5 | 0 | 0 |
|  |  | Mercapto-propionic acid | 0 | 0 | 0.5 |
|  | Mono-functional acrylate parts | ACMO | 0 | 0 | 10 |
|  | Leveling agent part | MEGAFACK F177 | 0.1 | 0 | 0 |
|  |  | NUC SILICONE L7002 | 0 | 0.2 | 0 |
|  | Photopoly-merization initiator parts | IRGACURE-1700 | 0 | 5 | 0 |
|  |  | RUCILIN TPO | 0 | 0 | 5 |
|  |  | DALOCURE-1173[c)] | 5 | 0 | 0 |
|  | Viscosity (cps/25° C.) |  | 1890 | 740 | 2380 |

The abbreviations in Table 7 other than the following have the same meanings as in Tables 1, 3 and 5.

a) M-210: ARONIX M-210; Diacrylate of adduct of bisphenol A with 4 moles of ethylene oxide manufactured by Toagosei Co., Ltd.

b) M-309: ARONIX M-309; Triacrylate of trimethylolpropane manufactured by Toagosei Co., Ltd.

c) DALOCURE-1173: 2-Hydroxy-2-methyl-1-phenylpropane-1-one manufactured by Ciba Geigy Corp.

TABLE 8

|  |  | Comparative Example No. | | |
|---|---|---|---|---|
|  |  | 5 | 6 | 7 |
| Results of evaluation | Dent-filling property | o | o | X |
|  | Surface smoothness | o | o | X |
|  | Etching resistance | X | o | X |
|  | Alkali solubility or peelability | o | X | o |
|  | Pattern formability | X | X | X |

As clear from the above examples, the curable compositions of the present invention for back-protecting protecting material used in making shadow masks are readily and rapidly cured by irradiation with active energy rays or by heating, and the cured film is excellent in all of etching resistance, alkali solubility or peelability, and pattern formability even when the second etching is carried out at high temperatures.

Furthermore, since the composition of the present invention does not require an organic solvent, a drying oven for evaporation of the organic solvent and a recovery device for the solvent are not necessary, there is no fear for toxicity of the organic solvent in handling of raw materials, and the risks of ignition and explosion at drying can be avoided.

In addition, curing can be performed in a short time without the drying step which causes evaporation of the organic solvent, cost for energy can be reduced and fire can be prevented, and the existing steps can be utilized to attain improvement. In these respects, the present composition is useful, and is markedly high in industrial value.

What is claimed is:

1. A curable composition for back-protecting materials used at a second etching step in making shadow masks which comprises the following components (a), (b) and (c) and which gives a cured film having alkali solubility or alkali peelability:
    (a) a compound having one carboxyl group and one (meth)acryloyl group,
    (b) a tri(meth)acrylate of an alkylene oxide adduct of isocyanuric acid, and
    (c) (c1) a (meth)acrylate compound having two or more (meth)acryloyl groups, (c2) a chain transfer agent, or a combination of (c1) and (c2).

2. A curable composition according to claim 1, which additionally contains a (meth)acrylate compound having one (meth)acryloyl group.

3. A curable composition according to claim 1, which additionally contains a leveling agent.

4. A curable composition according to claim 1, which additionally contains an acylphosphine oxide or 1-hydroxycyclohexylphenyl ketone or a combination of them as a photopolymerization initiator.

5. A curable composition according to claim 1, wherein the proportion of the component (a) is 20–80 weight % based on the total weight of the component (a), the component (b) and the component (c1).

6. A curable composition according to claim 2, wherein the proportion of the component (a) is 20–80 weight % based on the total weight of the component (a), the component (b), the component (c1), and the (meth)acrylate compound having one (meth)acryloyl group.

7. A curable composition according to claim 1, wherein the proportion of the component (b) is 5–60 weight % based on the total weight of the component (a), the component (b) and the component (c1).

8. A curable composition according to claim 2, wherein the proportion of the component (b) is 5–60 weight % based on the total weight of the component (a), the component (b), the component (c1), and the (meth)acrylate compound having one (meth)acryloyl group.

9. A curable composition according to claim 1, wherein the proportion of the component (c1) is 3–40 weight % based on the total weight of the component (a), the component (b) and the component (c1).

10. A curable composition according to claim 2, wherein the proportion of the component (c1) is 3–40 weight % based on the total weight of the component (a), the component (b), the component (c1), and the (meth)acrylate compound having one (meth)acryloyl group.

11. A curable composition according to claim 1, wherein the proportion of the component (c2) is 0.01–5 parts by weight per 100 parts by weight in total of the component (a), the component (b) and the component (c1).

12. A curable composition according to claim 2, wherein the proportion of the component (c2) is 0.01–5 parts by weight per 100 parts by weight in total of the component (a), the component (b), the component (c1), and the (meth)acrylate compound having one (meth)acryloyl group.

13. A curable composition according to claim 2, which additionally contains a leveling agent.

14. A curable composition according to claim 2, which additionally contains an acylphosphine oxide or 1-hydroxycyclohexylphenyl ketone or a combination of them as a photopolymerization initiator.

15. A curable composition according to claim 3, wherein the proportion of the leveling agent is 0.01–5 parts by weight per 100 parts by weight in total of the component (a), the component (b) and the component (c1).

16. A curable composition according to claim 13, wherein the proportion of the leveling agent is 0.01–5 parts by weight per 100 parts by weight in total of the component (a), the component (b), the component (c1), and the (meth)acrylate compound having one (meth)acryloyl group.

17. A curable composition according to claim 4, wherein the proportion of the photopolymerization initiator is 0.1–15 parts by weight per 100 parts by weight in total of the component (a), the component (b) and the component (c1).

18. A curable composition according to claim 14, wherein the proportion of the photopolymerization initiator is 0.1–15 parts by weight per 100 parts by weight in total of the component (a), the component (b), the component (c1), and the (meth)acrylate compound having one (meth)acryloyl group.

19. A curable composition according to claim 2, wherein the proportion of the (meth)acrylate compound having one (meth)acryloyl group is at most 40 weight % based on the total weight of the component (a), the component (b), the component (c1), and the (meth)acrylate compound having one (meth)acryloyl group.

* * * * *